United States Patent [19]
Lee et al.

[11] Patent Number: 6,104,668
[45] Date of Patent: Aug. 15, 2000

[54] PROGRAMMABLE MODE REGISTER FOR USE IN SYNCHRONIZED MEMORY DEVICE

[75] Inventors: Dong-Woo Lee, Seoul; Heung-Soo Im, Suwon, both of Rep. of Korea

[73] Assignee: Samsung Electronics, Co., Ltd., Suwon, Rep. of Korea

[21] Appl. No.: 09/366,284

[22] Filed: Aug. 2, 1999

[30]    Foreign Application Priority Data

Jul. 31, 1998 [KR] Rep. of Korea .................. 98-31289

[51] Int. Cl.⁷ .................................................. G11C 8/00
[52] U.S. Cl. ............................... 365/233; 365/230.08
[58] Field of Search ............................ 365/233, 189.05, 365/230.08, 178, 154, 96

[56]           References Cited

U.S. PATENT DOCUMENTS

| | | | |
|---|---|---|---|
| 5,771,199 | 6/1998 | Lee | 365/230.03 |
| 5,808,948 | 9/1998 | Kim et al. | 365/201 |
| 5,812,475 | 9/1998 | Lee et al. | 365/222 |
| 5,854,769 | 12/1998 | Lee | 365/230.02 |
| 5,986,918 | 11/1999 | Lee | 365/103 |

*Primary Examiner*—David Nelms
*Assistant Examiner*—Thong Le
*Attorney, Agent, or Firm*—Marger Johnson & McCollom, P.C.

[57]            ABSTRACT

Disclosed is a nonvolatile semiconductor memory device which comprises a mode register for storing the data for controlling plural operating modes, for instance, the RAS and the CAS latency, the burst length, and the burst type, of the memory device. The mode register of the present invention comprises a plurality of programmable elements, and a default value of the mode register is set depending on whether or the programmable elements are programmed. Furthermore, each of the programmable elements is comprised of the same element as the memory cells of the memory device. With the present invention, various default values for the mode register are set in accordance with the user's requirement without an additional process step.

13 Claims, 3 Drawing Sheets

PROGRAMMABLE MODE REGISTER FOR USE IN SYNCHRONIZED MEMORY DEVICE

FIELD OF THE INVENTION

The present invention relates to semiconductor integrated circuit devices, and more particularly to a programmable mode register for use in a semiconductor memory device which operates in synchronization with a clock signal.

BACKGROUND OF THE INVENTION

As is well known in the art, for a synchronous memory device to properly operate in synchronization with a clock signal, a default value of a mode register implemented in the synchronous memory device has to be set before the synchronous memory device enters a normal operation mode. If default value of the mode register is not set, the synchronous memory device does not operate properly.

In order to ensure the proper operation of the memory device, first, the user provides an address having mode information in the mode register after power-up and before the performance of the normal operation mode. In the mode register, generally, a row address strobe (RAS) latency, a column address strobe (CAS) latency, a burst type, a burst length, etc. are programmed. The value of the mode register can be changed after power-up. However, in general, the set value of the mode register after power-up continues to be used.

Referring to FIG. 1, a circuit diagram showing a conventional mode register is illustrated. In FIG. 1, a signal PVCCH indicates a power level. The signal PVCCH has a logic low level when the power is less than a predetermined level, and has a logic high level when the power is higher than the predetermined level. A signal nPVCCH is complementary to the signal PVCCH.

When the signal PVCCH is at a logic low level, PMOS and NMOS transistors MP1 and MN1 are turned on, setting a node Ni at a logic high level and a node N2 set at a logic low level. The logic levels at the nodes N1 and N2 are respectively held in corresponding latches 12 and 14 which are composed of two latched inverters. Therefore, a default value of a signal MDST1 is set low, and a default value of a signal MDST2 is set high. The default values of the signals MDST1 and MDST2 can be changed in accordance with the corresponding mode register address signals MRA1 and MRA2. When the signal PVCCH is set to a logic high level, the PMOS and NMOS transistors MP1 and MN1 are turned off.

Now, turning to FIG. 2, a circuit diagram showing another conventional mode register is illustrated. In FIG. 2, the constituent elements that are identical to those of FIG. 1 are labeled with the same reference numerals. The mode register 10 of FIG. 2 differs from that of FIG. 1 only in that the diode-connected NMOS and PMOS transistors MN2 and MP2 are added. The NMOS and PMOS transistors MN2 and MP2 serve as a metal option, respectively. That is, the NMOS and PMOS transistors MN2 and MP2 may be formed selectively. Therefore, the respective nodes N1 and N2 can be set low or high in accordance with whether or the transistors MN2 and MP2 are formed.

The above described conventional mode register structure, however, is often inappropriate to meet the various requirements from the user. Each synchronous semiconductor memory device that comprises a mode register set with a different default value of the mode register must be manufactured separately. As a result, the variety of mode register default configurations of the respective memory devices cause an additional process burden, respectively.

SUMMARY OF THE INVENTION

It is therefore an object of the present invention to provide a programmable mode register for use in a nonvolatile semiconductor memory device which operates in synchronization with a clock signal.

In order to attain the above objects, according to an aspect of the present invention, there is provided a nonvolatile semiconductor memory device which comprises a memory cell array having a plurality of memory cells each of which stores data; and a mode register for storing data for controlling plural operating modes of the memory device. The mode register comprises a plurality of programmable elements, and a default value of the mode register is set depending on whether or not the programmable elements are programmed. Furthermore, the programmable elements are comprised of the same element as the memory cells, respectively.

According to the present invention, the mode register comprises a PMOS transistor having a first current electrode connected to a power supply voltage and a gate electrode receiving a first control signal; a first programmable element connected between a second current electrode of the first transistor and a node; an NMOS transistor having a first current electrode grounded and a gate electrode receiving a second control signal complementary to the first control signal; a second programmable element connected between the node and a second current electrode of the second transistor; and a latch connected to the node. Each of the first and second programmable elements is preferably comprised of a fuse or a depletion transistor.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

A preferred embodiment of the present invention will be more fully described below with reference to the accompanying drawings.

In this embodiment, the nonvolatile semiconductor memory device operates in synchronization with a clock signal. In particular, the memory device is a synchronous mask read-only memory device. The mode register of the synchronous mask read-only memory device stores the data for controlling the various operating modes thereof. For instance, it programs the RAS latency, the CAS latency, the burst length, and the burst type. If the user wants to change its values, the user must exit from power down mode and start the mode register before entering the normal operation mode. The synchronous mask read-only memory device is disclosed in the specification of the SAMSUNG electronics, entitled "KM23V32205T", which is herein incorporated by reference.

As is disclosed in the KM23V32205T, the mode register is programmed by use of 7-bit address (for instance, A0–A6). The address signals A0 and A1 are used to set the burst length, the address signal A2 to set the burst type, the address signals A3–A5 to set the CAS latency, and the address signal A6 to set the RAS latency.

Figure 1:
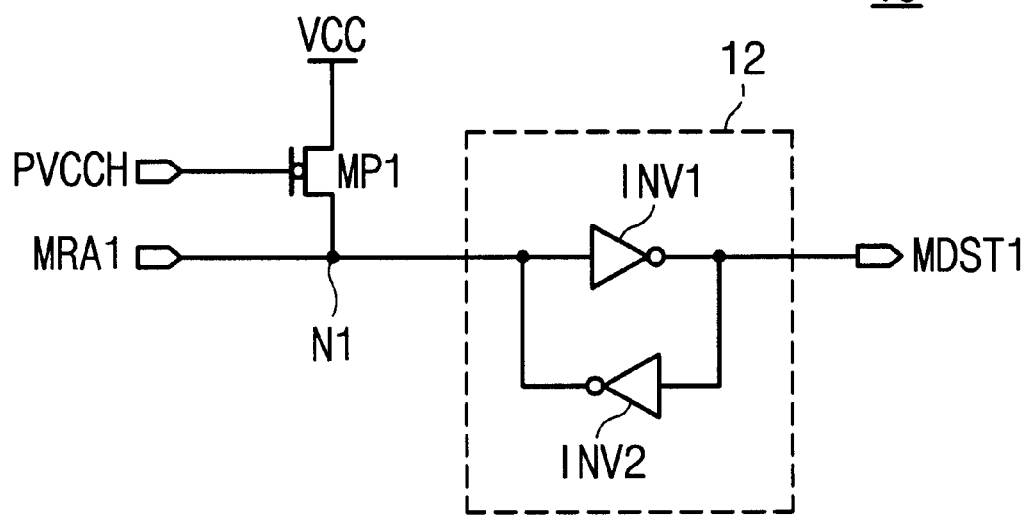
FIG. 1 shows a circuit diagram showing a conventional mode register.
Figure 1:
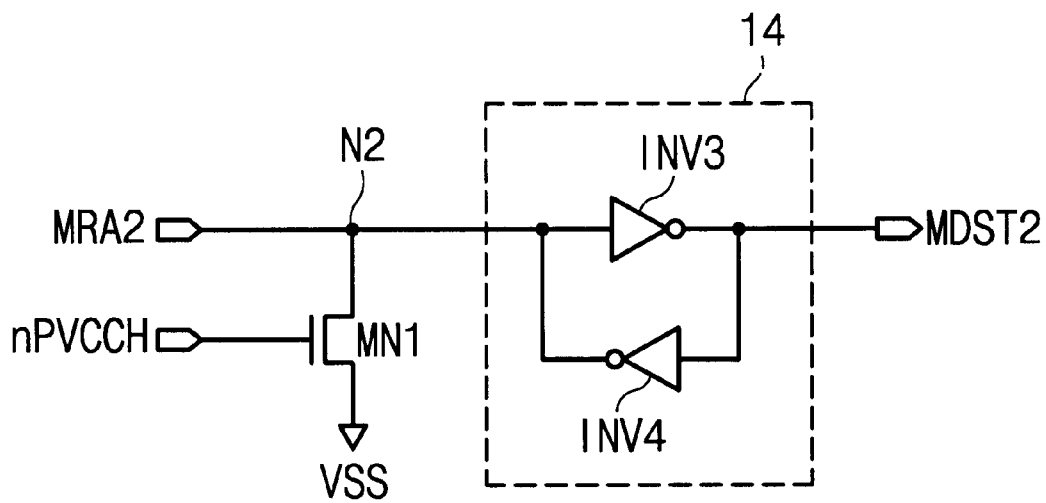
Figure 2:
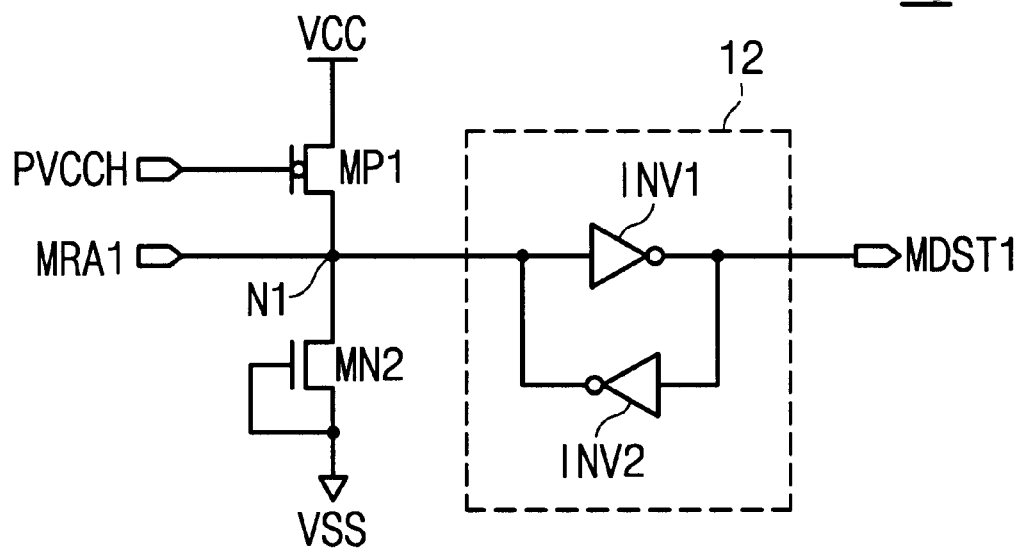
FIG. 2 shows a circuit diagram showing another conventional mode register.
Figure 2:
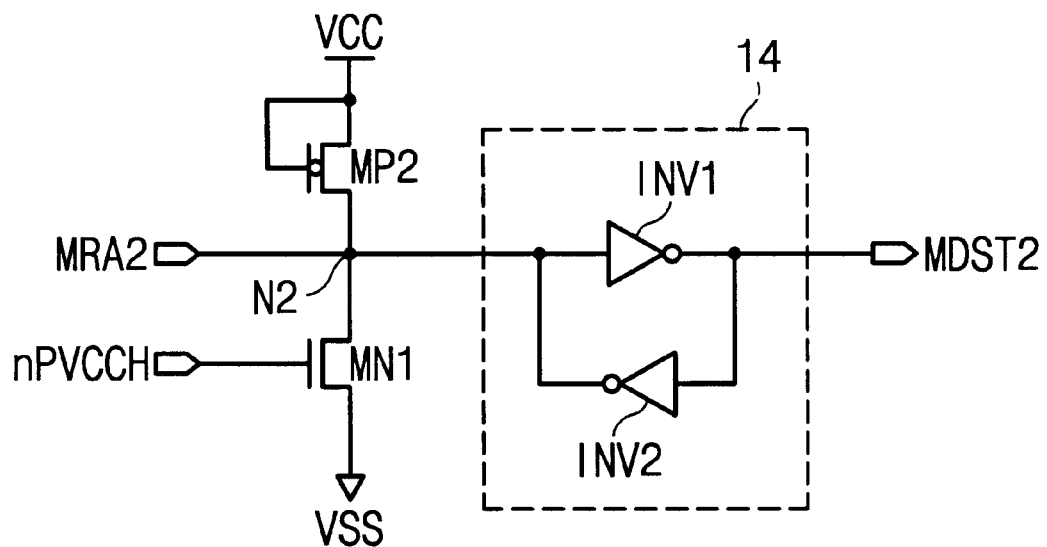
Figure 3:
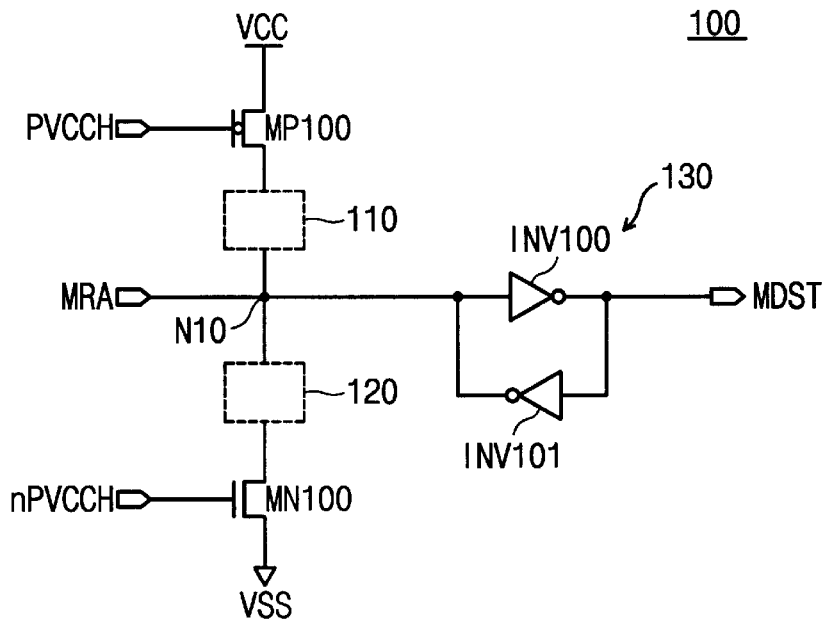
FIG. 3 shows a circuit diagram showing a mode register according to the present invention.
Figure 4:
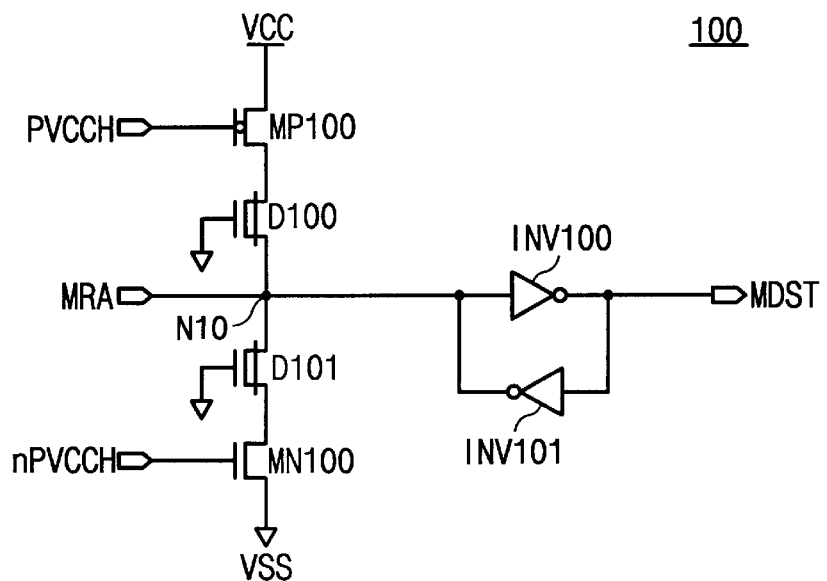
FIG. 4 is a preferred embodiment of a mode register illustrated in FIG. 3.

FIG. 3 is a circuit diagram of a mode register for a nonvolatile semiconductor memory device according to the present invention, and FIG. 4 is a preferred embodiment of the mode register illustrated in FIG. 3. In FIG. 3, part of the mode register 100 is illustrated. According to the above described condition, the mode register address signal MRA corresponds to one of the 7-bit address signals A0–A7. Therefore, the same circuit configuration as illustrated in FIG. 3 may be further provided in the mode register 100 of FIG. 3 so as to correspond to the other 6-bit address signals, respectively.

Referring to FIG. 3, the mode register 100 comprises PMOS and NMOS transistors and MN100, first and second programmable elements 110 and 120, and a latch 130 having two latched inverters INV100 and INV101. The PMOS transistor MP100 has a source connected to the power supply voltage VCC and a gate electrode receiving a signal PVCCH. The first programmable element 110 is connected between a drain of the transistor MP100 and a node N10, which is used as an input terminal for receiving an externally applied mode register address signal MRA. The second programmable element 120 is connected between the node N10 and a drain of the NMOS transistor MN100, which has a source grounded and a gate electrode receiving a signal nPVCCH. To the node N10, the latch 130 is connected.

In this embodiment, the signal PVCCH indicates a power level. The signal PVCCH has a logic low level when the power is less than a predetermined level, and has a logic high level when the power is higher than the predetermined level. The signal nPVCCH is complementary to the signal PVCCH.

As illustrated in FIG. 4, the first and second programmable elements 110 and 120 are implemented by use of a depletion transistor, respectively. That is, the depletion transistor D100 used as the first programmable element 110 has a gate electrode grounded, a first current electrode connected to the drain of the transistor MP100, and a second current electrode coupled to the node N10. The depletion transistor D101 used as the second programmable element 120 has a gate electrode grounded and a channel connected between the node N10 and the drain of the transistor MN100.

Since the mode register 100 is integrated in the synchronous mask ROM device, the depletion transistors D100 and D101 may be formed by the same process as memory cells of the mask ROM device. When the memory cells are programmed by ion implementation, the transistors D100 and D101 also can be programmed. As a result, the transistors D100 and D101 have an on state or an off state that depends on whether they received ion implantation programming. When a transistor D100 or D101 is programmed, its threshold voltage is increased. A programmed transistor is turned off because its programmed threshold is greater than the gate voltage. An unprogrammed transistor has a threshold voltage lower than the gate voltage and is turned on. Furthermore, the default value of the node N10 can be set with a different value in accordance with the mode register address signal MRA.

According to the mode register 100 of the present invention, a voltage level of its output signal MDST can be set by programming either depletion transistor D100 or D101. For instance, when the depletion transistor D100 is programmed, it is maintained at the off state while the transistor D101 is at the on state. And, when the depletion transistor D101 is programmed, it is maintained at the off state while the transistor D100 is at the on state. In the former case, when the signals PVCCH and nPVCCH go low and high, respectively, the node N10 is grounded, so that the default value of the signal MDST is set at a logic high level. In the latter case, when the signals PVCCH and nPVCCH go low and high, respectively, the node N10 is charged up to the power supply voltage VCC, so that the default value of the signal MDST is set at a logic low level.

According to the above described mode register structure of the synchronous mask ROM device, the programmable elements 110 and 120 are simultaneously programmed without additional process steps when the memory cells of the mask ROM device are programmed by ion implantation. Furthermore, since ion implantation is performed in accordance with ROM code provided by the user, only a single mask for the ion implantation process may be used when the ROM code and the default value of the mode register 100 are provided from the user. Therefore, unlike the conventional mode register configuration, various default values for the mode register 100 are set in accordance with the user's requirement without an additional process step.

In case of a synchronous flash memory device, the programmable elements 110 and 120 of FIG. 3 can be replaced with a transistor having a floating gate, for example, an EERPOM or EPROM transistor, respectively. Although not shown in the figure, the transistor having the floating gate may be programmed in the same manner as memory cells of the synchronous flash memory device are programmed. Also, the programmable elements 110 and 120 can be realized by fuse elements such as laser fuses.

The present invention has been described using an exemplary preferred embodiment. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A mode register for use in a semiconductor memory device having a memory cell array for storing data, wherein the mode register stores data for controlling various operating modes of the memory device, the mode register comprising:

a first transistor having a first current electrode connected to a power supply voltage and a gate electrode receiving a first control signal;

a first programmable element connected between a second current electrode of the first transistor and a node;

a second transistor having a first current electrode grounded and a gate electrode receiving a second control signal complementary to the first control signal; and a second programmable element connected between the node and a second current electrode of the second transistor.

2. The mode register according to claim 1, further comprising a latch connected to the node.

3. The mode register according to claim 2, wherein the first and the second programmable elements each have a conductive first programmable state and a non-conductive second programmable state.

4. The mode register according to claim 3, wherein the semiconductor memory device comprises a mask read-only memory device that operates in synchronization with a clock signal.

5. The mode register according to claim 4, wherein each of the first and second programmable elements is comprised of a depletion transistor, respectively, and wherein one of the depletion transistors is programmed at the first or second state during an ion implantation process for memory cells of the synchronous mask read-only memory device.

6. The mode register according to claim 3, wherein each of the first and second programmable elements is comprised of a fuse.

7. The mode register according to claim 3, wherein the semiconductor memory device is a flash memory device which operates in synchronization with a clock signal.

8. The mode register according to claim 1, wherein each of the first and second programmable elements is comprised of a transistor having a floating gate.

9. The mode register according to claim 1, wherein the node is set at either of a logic low level and a logic high level in response to an externally applied mode register address signal.

10. The mode register according to claim 1, wherein the first control signal has a logic low level when the power supply voltage is less than a predetermined level, and has a logic high level when the power supply voltage is higher than the predetermined level.

11. A nonvolatile semiconductor memory device comprising:
   a memory cell array of a plurality of memory cells, each of memory cells having a data storage element; and a mode register for storing data for controlling plural operating modes of the memory device,
   wherein the mode register comprises a plurality of programmable elements, the mode resister having a default value;
   wherein the default value of the mode register is set depending on whether or not the programmable elements are programmed;
   wherein the programmable elements each comprises a data storage element of the same type as the data storage element of a memory cell; and
   wherein the nonvolatile memory device operates in synchronization with a clock signal.

12. The memory device according to claim 11, wherein the nonvolatile memory device is comprised of one selected from a mask read-only memory device and a flash memory device.

13. The memory device according to claim 12, wherein the mode register comprises:
   a PMOS transistor having a first current electrode connected to a power supply voltage and a gate electrode receiving a first control signal;
   a first one of the programmable elements connected between a second current electrode of the first transistor and a node;
   an NMOS transistor having a first current electrode grounded and a gate electrode receiving a second control signal complementary to the first control signal;
   a second one of the programmable elements connected between the node and a second current electrode of the second transistor; and
   a latch connected to the node.

* * * * *

UNITED STATES PATENT AND TRADEMARK OFFICE
CERTIFICATE OF CORRECTION

PATENT NO. : 6,104,668  
DATED : August 15, 2000  
INVENTOR(S) : Dong-Woo Lee and Heung-Soo Im Page 1 of 1

It is certified that error appears in the above-identified patent and that said Letters Patent is hereby corrected as shown below:

<u>Title page,</u>  
Item [57], ABSTRACT,  
"whether or the" should read -- whether or not the --;

<u>Column 1,</u>  
Line 39, "a node Ni" should read -- a node N1 --;  
Line 60, "whether or the" should read -- whether or not the --;

<u>Column 3,</u>  
Line 19, "transistors and MN100" should read -- transistors MP100 and MN100 --.

Signed and Sealed this

Second Day of July, 2002

*Attest:*

*Attesting Officer*

JAMES E. ROGAN  
*Director of the United States Patent and Trademark Office*